(12) United States Patent
Srikanth et al.

(10) Patent No.: US 11,756,606 B2
(45) Date of Patent: Sep. 12, 2023

(54) METHOD AND APPARATUS FOR RECOVERING REGULAR ACCESS PERFORMANCE IN FINE-GRAINED DRAM

(71) Applicant: Advanced Micro Devices, Inc., Santa Clara, CA (US)

(72) Inventors: Sriseshan Srikanth, Austin, TX (US); Vignesh Adhinarayanan, Austin, TX (US); Jagadish B. Kotra, Austin, TX (US); Sergey Blagodurov, Bellevue, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/549,359

(22) Filed: Dec. 13, 2021

(65) Prior Publication Data

US 2023/0186976 A1 Jun. 15, 2023

(51) Int. Cl.
| | |
|---|---|
| *G11C 11/4093* | (2006.01) |
| *G11C 11/4096* | (2006.01) |
| *H03K 19/17728* | (2020.01) |
| *G11C 8/18* | (2006.01) |
| *H03K 19/173* | (2006.01) |
| *G11C 11/408* | (2006.01) |

(52) U.S. Cl.
CPC ............ *G11C 11/4093* (2013.01); *G11C 8/18* (2013.01); *G11C 11/4087* (2013.01); *G11C 11/4096* (2013.01); *H03K 19/1737* (2013.01); *H03K 19/17728* (2013.01)

(58) Field of Classification Search
CPC .......................... G11C 11/4093; G11C 11/4096

USPC ..................................................... 365/189.05
See application file for complete search history.

(56) References Cited

U.S. PATENT DOCUMENTS

| | | | |
|---|---|---|---|
| 5,819,305 A | 10/1998 | Nixon | |
| 2006/0023533 A1* | 2/2006 | Song ...................... | G11C 7/06 365/205 |
| 2007/0268765 A1 | 11/2007 | Woo et al. | |
| 2008/0028135 A1 | 1/2008 | Rajan et al. | |
| 2008/0062807 A1 | 3/2008 | Ware et al. | |
| 2009/0157994 A1 | 6/2009 | Hampel et al. | |
| 2016/0132241 A1 | 5/2016 | Perego et al. | |
| 2018/0018105 A1 | 1/2018 | Magro et al. | |
| 2021/0041929 A1* | 2/2021 | Connor .................. | H04L 12/10 |
| 2022/0012173 A1* | 1/2022 | Galbi .................. | G06F 12/0646 |

OTHER PUBLICATIONS

International Search Report and Written Opinion for International Application No. PCT/US2022/052164 dated Apr. 21, 2023, 7 pages.

* cited by examiner

*Primary Examiner* — Anthan Tran
(74) *Attorney, Agent, or Firm* — Polansky & Associates, P.L.L.C.; Paul J. Polansky; Nathan H. Calvert

(57) ABSTRACT

A fine-grained dynamic random-access memory (DRAM) includes a first memory bank, a second memory bank, and a dual mode I/O circuit. The first memory bank includes a memory array divided into a plurality of grains, each grain including a row buffer and input/output (I/O) circuitry. The dual-mode I/O circuit is coupled to the I/O circuitry of each grain in the first memory bank, and operates in a first mode in which commands having a first data width are routed to and fulfilled individually at each grain, and a second mode in which commands having a second data width different from the first data width are fulfilled by at least two of the grains in parallel.

11 Claims, 7 Drawing Sheets

__US 11,756,606 B2__

METHOD AND APPARATUS FOR RECOVERING REGULAR ACCESS PERFORMANCE IN FINE-GRAINED DRAM

BACKGROUND

High bandwidth dynamic random-access memory (DRAM) are used by Graphics Processing Units (GPUs) and other throughput-oriented parallel processors. Successive generations of GPU-specific DRAMs have been optimized primarily to maximize bandwidth first by employing high-frequency off-chip signaling such as that used with Graphics Double-Data Rate memories and, more recently, through on-package integration of the processor die and wide, high-bandwidth interfaces to stacks of DRAM chips, such as those used in High Bandwidth Memory (HBM/HBM2) modules.

Many key workload classes for such systems experience irregular, fine-grained memory accesses. Such workloads include graph traversal (used extensively in social networking, search, e-commerce, cloud, and the gig economy), key-value store access, and high performance computing (HPC). The next generation of grain-based stacked DRAM is important in enabling energy-efficient, high bandwidth fine grained irregular accesses.

Fine-grained DRAM (FG-DRAM) enables stacked DRAM memories such as HBM to scale memory bandwidth while not exceeding practical Thermal Design Power (TDP) limits. FG-DRAM does so by partitioning the DRAM die into smaller independent units (called grains), each with dedicated DQ pins, but not command-address (CA) pins. For example, a traditional DRAM bank may be divided in two, to realize two grains with half the number of columns each as compared to the original bank. As a result, a significant increase in memory-level parallelism is obtained. Additionally, a significant reduction in activation energy is realized.

However, in such grain-based architectures, because each grain now has a narrower interface to the DRAM channel, the access latency of a DRAM atom via a column access command to an open row increases proportionately to the number of grains per bank. Such an increase is deleterious for latency-sensitive, regular access workloads.

Figure 1:
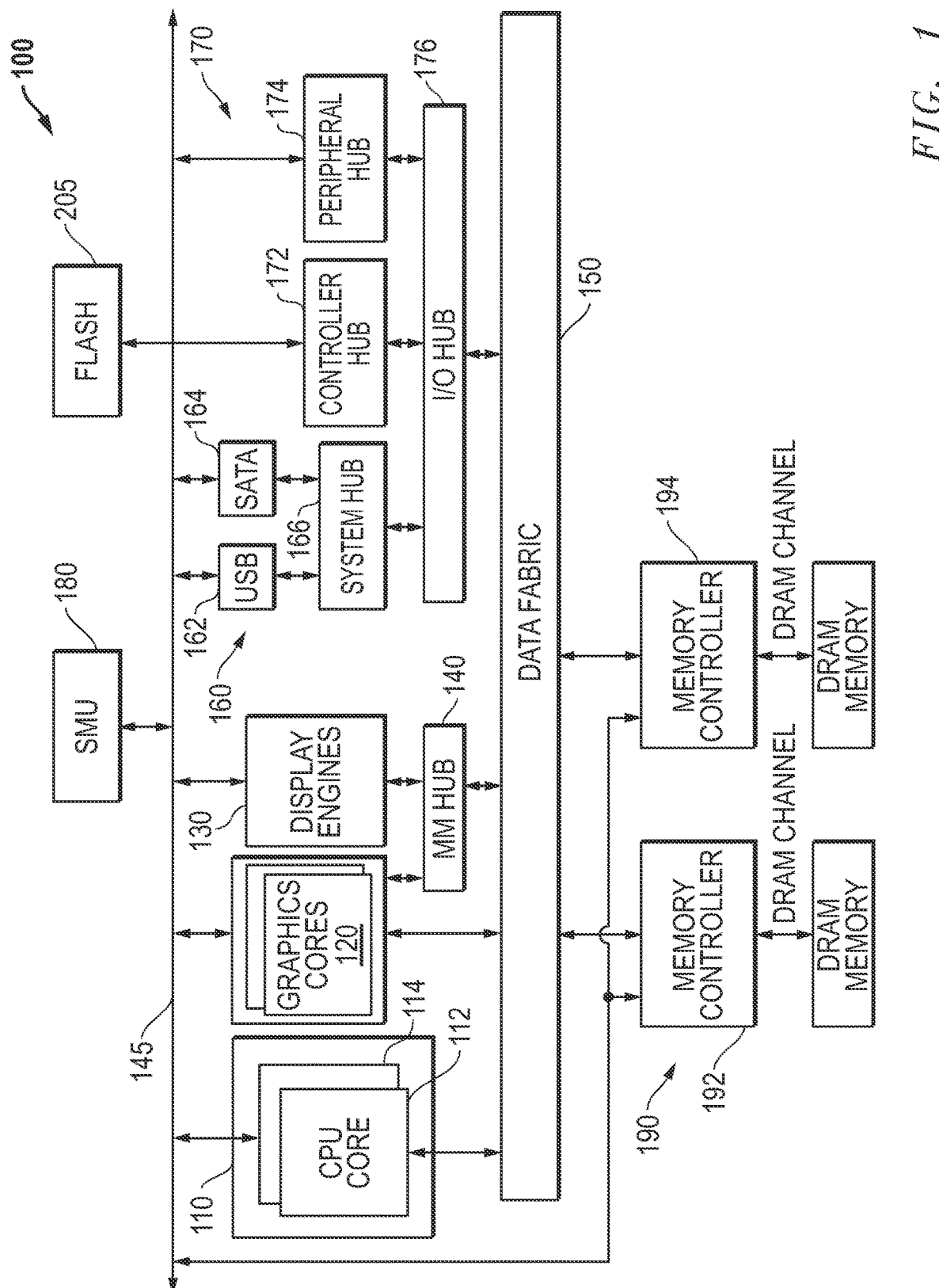
FIG. 1 illustrates in block diagram form an accelerated processing unit (APU) and memory system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A fine-grained dynamic random-access memory (DRAM) includes a first memory bank, a second memory bank, and a dual mode I/O circuit. The first memory bank includes a memory array divided into a plurality of grains, each grain including a row buffer and input/output (I/O) circuitry. The dual-mode I/O circuit is coupled to the I/O circuitry of each grain in the first memory bank, and operates in a first mode in which commands having a first data width are routed to and fulfilled individually at each grain, and a second mode in which commands having a second data width different from the first data width are fulfilled by at least two of the grains in parallel.

A method of operating a volatile memory includes sending column address strobe (CAS) command from a memory controller to first grain in a first bank on said volatile memory. The method includes sending a multi-cast CAS command to a dual-mode I/O circuit on said volatile memory. Responsive to the multi-cast CAS command, at said volatile memory, the method includes sending a CAS signal to multiple grains including said first grain.

A data processing system includes a plurality of processing units, a data fabric coupled to the plurality of processing units, a memory controller coupled to the data fabric for fulfilling memory access requests from the processing units, and fine-grained dynamic random-access memory (DRAM) in communication with the memory controller. The fine-grained DRAM includes a first memory bank, a second memory bank, and a dual-mode I/O circuit. The first memory bank includes a memory array divided into a plurality of grains, each grain including a row buffer and input/output (I/O) circuitry. The dual-mode I/O circuit is coupled to the I/O circuitry of each grain in the first memory bank, the dual-mode I/O circuit operating in a first mode in which commands having a first data width are routed to and fulfilled individually at each grain, and a second mode in which commands having a second data width different from the first data width are fulfilled by at least two of the grains in parallel.

FIG. 1 illustrates in block diagram form an accelerated processing unit (APU) 100 according to some embodiments. APU 100 is implemented as a System-on-Chip (SoC) which may be part of a variety of host data processing platforms. While an APU is shown in this embodiment, other data processing platforms such as a central processing unit (CPU) or a graphics processing unit (GPU) may be used. For example, in some embodiments, the fine-grained memory access techniques herein are embodied in a GPU chip employed in a graphics card or other graphics processing module. In other embodiments, specialized processor cores such as intelligence processing units (IPUs) may be employed. In this embodiment, APU 100 includes generally a CPU core complex 110, a graphics core 120, a set of display engines 130, a memory management hub 140, a data fabric 150, a set of peripheral controllers 160, a set of peripheral bus controllers 170, a system management unit (SMU) 180, a flash memory 205, and a set of FG_DRAM memory controllers 190.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN) 145, which forms a control fabric, and to data fabric 150, and is capable of providing memory access requests to data fabric 150. Each of CPU cores 112 and 114 may be unitary cores, or may further be a core complex with two or more unitary cores sharing certain resources such as caches.

Each of graphics cores 120 is a high performance graphics processing unit (GPU) capable of performing graphics operations such as vertex processing, fragment processing, shading, texture blending, and the like in a highly integrated and parallel fashion. Each graphics core 120 is bidirectionally connected to the SMN 145 and to data fabric 150, and is capable of providing memory access requests to data fabric 150. In this regard, APU 100 may either support a unified memory architecture in which CPU core complex 110 and graphics cores 120 share the same memory space, or a memory architecture in which CPU core complex 110 and graphics cores 120 share a portion of the memory space, while graphics cores 120 also uses a private graphics memory not accessible by CPU core complex 110.

Display engines 130 render and rasterize objects generated by graphics core 120 for display on a monitor. Graphics core 120 and display engines 130 are bidirectionally connected to a common memory management hub 140 for uniform translation into appropriate addresses in memory, and memory management hub 140 is bidirectionally connected to data fabric 150 for generating such memory accesses and receiving read data returned from the memory system.

Data fabric 150 includes a crossbar switch for routing memory access requests and memory responses between any memory accessing agent and memory controllers 190. It also includes a system memory map, defined by basic input/output system (BIOS), for determining destinations of memory accesses based on the system configuration, as well as buffers for each virtual connection.

Peripheral controllers 160 include a USB controller 162 and a serial advanced technology attachment (SATA) interface controller 164, each of which is bidirectionally connected to a system hub 166 and to SMN 145. These two controllers are merely exemplary of peripheral controllers that may be used in APU 100.

Peripheral bus controllers 170 include a system controller hub 172 and a peripheral controller hub 174, each of which is bidirectionally connected to an input/output (I/O) hub 176 and to SMN 145. System controller hub 172 connects to Flash memory 205 over a suitable communications link. I/O hub 176 is also bidirectionally connected to system hub 166 and to data fabric 150. Thus, for example, a CPU core can program registers in USB controller 162, SATA interface controller 164, system controller hub 172, or peripheral controller hub 174 through accesses that data fabric 150 routes through I/O hub 176.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 also manages power for the various processors and other functional blocks.

While a SoC implementation is shown, this is not limiting, and other computing platforms may also benefit from the techniques set forth herein.

Figure 2:
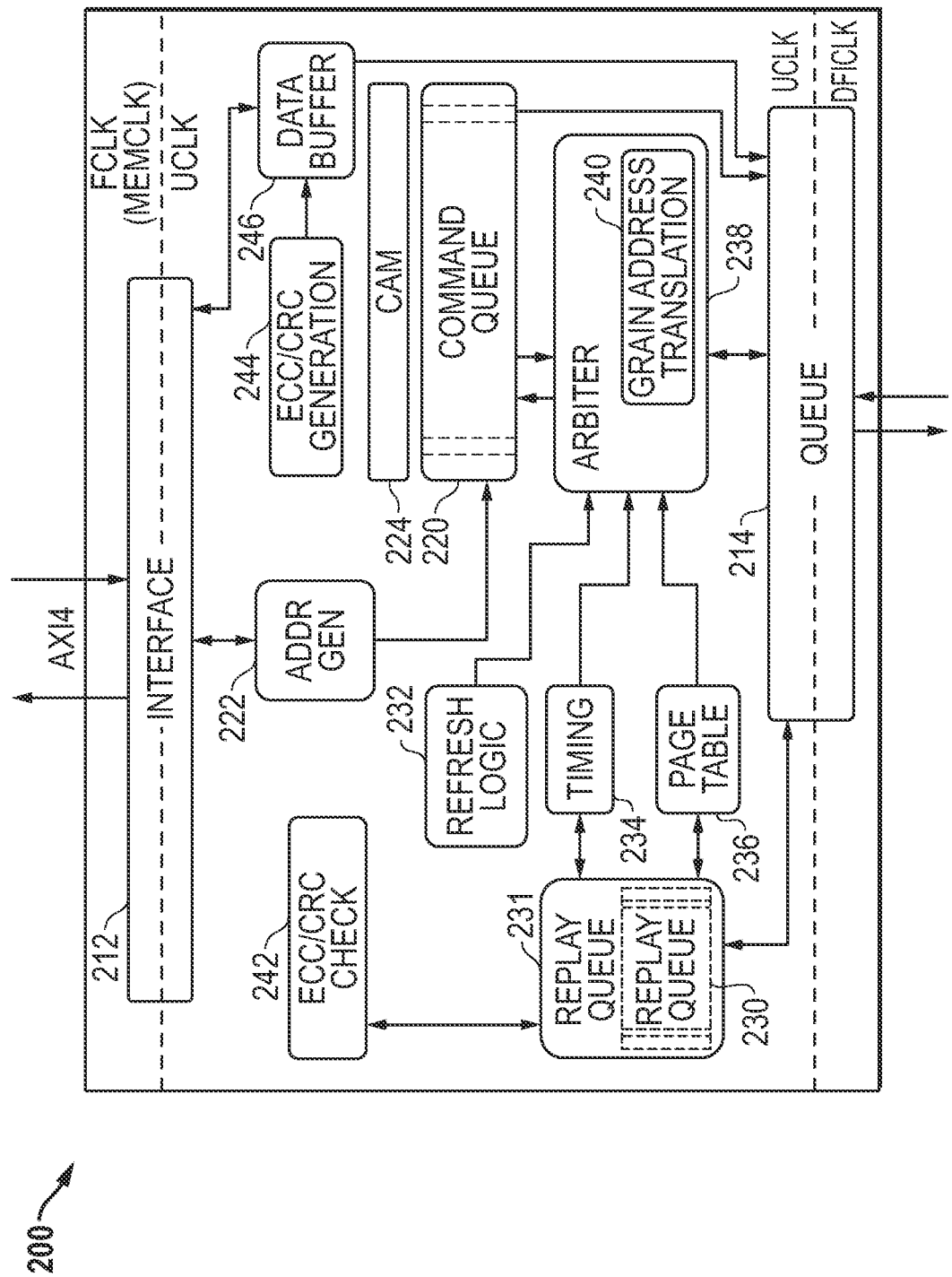
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally an interface 212, a memory interface queue 214, a command queue 220, an address generator 222, a content addressable memory (CAM) 224, replay control logic 231 including a replay queue 230, a refresh control logic block 232, refresh control logic 232, a timing block 234, a page table 236, an arbiter 238, an error correction code (ECC) check circuit 242, an ECC generation block 244, and a data buffer 246.

Interface 212 has a first bidirectional connection to data fabric over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from the data fabric over the AXI4 bus. The memory access requests include access addresses in the physical address space represented in a normalized format. Address generator 222 converts the normalized addresses into a format that can be used to address the actual memory devices in the memory system, as well as to efficiently schedule related accesses. This format includes a region identifier that associates the memory access request with a particular rank, a row address, a column address, a bank address, and a bank group. On startup, the system BIOS queries the memory devices in memory system to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules. Command queue 220 is a stacked command queue including multiple entry stacks each containing multiple command entries, in this embodiment 32 entry stacks of four entries each, as further described below.

Error correction code (ECC) generation block 244 determines the ECC of write data to be sent to the memory. This ECC data is then added to the write data in data buffer 246. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a replay sequence in which accesses are replayed in the case of a parity or ECC error of one of these cycles. Replayed commands are placed in the memory interface queue 214.

Refresh control logic 232 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh control logic 232 generates refresh commands periodically and in response to designated conditions to prevent data errors caused by leaking of charge off storage capacitors of memory cells in DRAM chips. Refresh control logic 232 includes an activate counter 248, which in this embodiment has a counter for each memory region which counts a rolling number of activate commands sent over the memory channel to a memory region. The memory regions are memory banks in some embodiments, and memory sub-banks in other embodiments as further discussed below. In addition, refresh control logic 232 periodically calibrates ZQ to prevent mismatch in on-die termination resistance due to thermal changes in the system.

Arbiter 238 is bidirectionally connected to command queue 220 and is the heart of memory controller 200, performing intelligent scheduling of accesses to improve the usage of the memory bus. In this embodiment, arbiter 238 includes a grain address translation block 240 for translating commands and addresses for fine-grained memory accesses in multiple modes, as further described below. In some embodiments, such functions may be performed by address generation block 222. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230. Arbiter 238 includes a single command input for each entry stack of command queue 220, and selects commands therefrom to schedule for dispatch through memory interface queue 214 to the DRAM channel.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Memory controller 200 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers (not shown) store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page.

Figures 3, 4, 5:
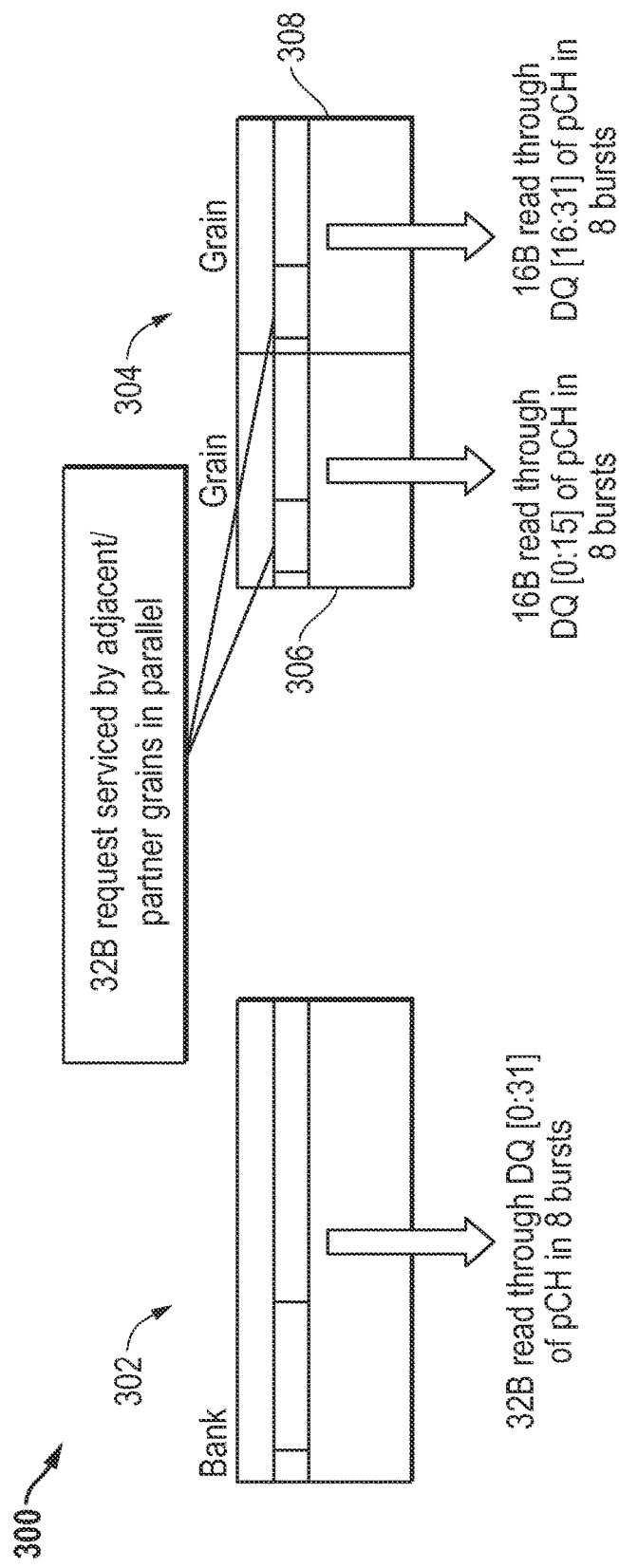
FIG. 3 shows a block diagram comparing two memory banks of two DRAMs illustrating the use of grains.
FIG. 4 shows in block diagram form an arrangement of address lines for a fine-grained DRAM memory interleaved in a grain-independent format.
FIG. 5 shows in block diagram form an arrangement of address lines for a fine-grained DRAM memory interleaved in a grain-striped format.

FIG. 3 shows a block diagram 300 comparing two memory banks 302 and 304 of two DRAMs illustrating the use of grains. DRAM bank 302 is constructed without grains, while DRAM bank 304 includes two grains 306 and 308. DRAM bank 304 is part of a larger DRAM integrated circuit including multiple DRAM banks. DRAM bank 304 generally includes a memory array divided into a plurality of grains, in this case two, each grain including a row buffer and input/output (I/O) circuitry.

The traditional, non-grain architecture of DRAM bank 302 can perform 32-byte (32B) memory accesses through 32 data lines DQ[0:31], accessed in 8 bursts or "beats" over the pseudo-channel (pCH) allocated to DRAM bank 302. Issuing a column command to an open row in a bank provides 32 bytes (32B) of data in 8 bursts, because the bank has access to all 32 DQ pins of a pseudo-channel, providing a 2× faster data read out as compared to the two-grain architecture of DRAM bank 304 because the pins are not partitioned. As a result, the time to read-out a 64B cache line from an open row, in a non-grain architecture, takes 2*8=16 bursts plus one additional column-to-column long delay time (tCCDL) minus a burst duration on the data bus (tBURST) of overhead time.

When using a fine-grained architecture without the techniques herein, DRAM bank 304 is accessed with 16B accesses over two designated sets of data lines, DQ[0:15] and DQ[16:31], of the pCH. In this exemplary arrangement with 16 DQ pins of a pseudo-channel dedicated to a grain, an open row in a grain responds to a column command by providing 16B of data in 8 bursts. The time to read-out a 64B cache line from an open row, therefore, takes 4*8=32 bursts, plus an additional 3 (tCCDL−tBURST) cycles of overhead. The grain architecture therefore incurs a 33% latency penalty for individual 32B accesses.

FIG. 4 shows in diagram form an arrangement of address lines for a fine-grained DRAM memory interleaved in a grain-independent format. In the depicted arrangement, the address line number is shown on the top with the use of the address line labelled below each address line number. "RO" stands for row, "CO" stands for column, "GR" stands for grain number, "BK" stands for bank number, "BG" stands for bank group number, "PCH" stands for pseudo-channel", and "X" indicates that the address line is not allocated. In the grain-independent address interleaving, no striping is done to enable irregular-throughput oriented 16B accesses, and the grain address bit at address line 12 is employed similarly to a bank address bit.

FIG. 5 shows in diagram form an arrangement of address lines for a fine-grained DRAM memory interleaved in a grain-striped format. The depicted implementation deploys a modified address interleaving at the memory controller in order to realize striped 32B placement of the grains with grain-striped address interleaving. 32B of data is split into two correlated grains of 16B each. The GR address bit is present at the least significant address line (line 4), meaning that adjacent grains are addressed by this bit. It is noted that this approach may be extended to support an increased number of grains per bank, such as four grains, eight grains, or sixteen grains, for example (theoretically limited only by the number of columns in the bank).

However, merely using the grain-striped address interleaving of FIG. 5 in isolation still suffers from an unacceptable additional 75% overhead, due to the tCCDL constraint existing between column commands to the same physical bank. This overhead can be lowered to that of tCCDS in some implementations by decoupling "partner" grains (grains that function with adjacent addresses) into different bank-groups. However, even in such implementations, the overhead is still non-negligible. Furthermore, such decoupling of partner grains into different bank-groups imposes additional scheduling and data response reconstruction complexity on the memory controller to avoid asynchronous latencies between the two grains.

Figure 6:
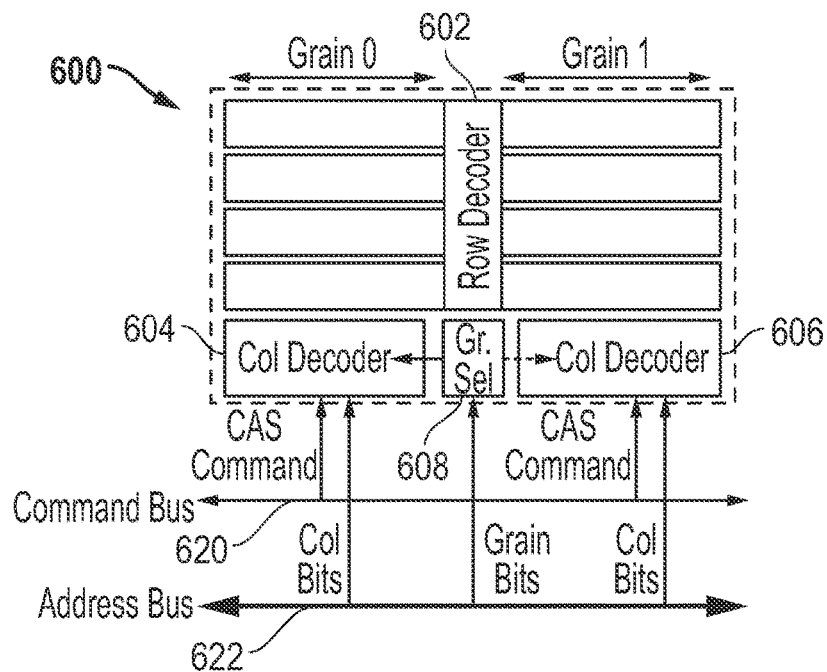
FIG. 6 illustrates in block diagram form a fine-grained memory bank according to the prior art.
Figure 7:
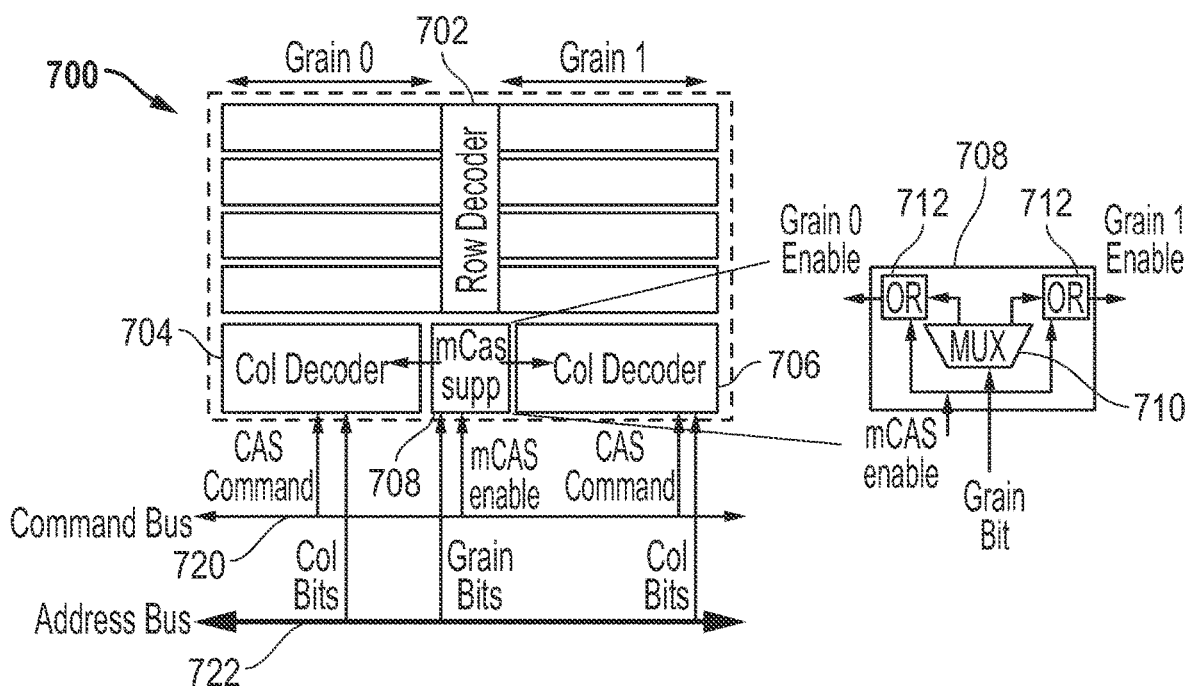
FIG. 7 illustrates in block diagram form a fine-grained memory bank according to some embodiments.

FIG. 6 illustrates in block diagram form a fine-grained memory bank 600 according to the prior art, while FIG. 7 illustrates in block diagram form a fine-grained memory bank 700 according to some embodiments.

Memory bank 600 includes two grains labeled "Grain 0" and "Grain 1", a row decoder 602, two column decoders 604 and 606, a grain select circuit 608 labelled "Gr. Sel", a command bus 620, and an address bus 622. In operation, memory bank 600 is accessed with commands such as the depicted column-address-strobe (CAS) commands sent over command bus 620 from a memory controller. As shown, address bus 622 provides the column address bits (CO) to column decoders 604 and 606, and a grain bit (GR) to grain selector circuit 608 according to the address scheme of FIG. 4. Memory accesses are the width of one grain, in this example 16B.

Referring to FIG. 7, memory bank 700 includes two grains labeled "Grain 0" and "Grain 1", and I/O circuitry including a row decoder 702, two column decoders 704 and 706, a row buffer in each grain (not shown separately), a dual-mode input/output (I/O) circuit 708 labeled "mCAS supp." (mCAS support), a command bus labeled 720, and an address bus 722. In this implementation, dual-mode I/O circuit 708 is connected to the I/O circuitry of each grain in the memory bank.

Dual mode I/O circuit 708 includes a first input labeled "mCAS enable", a second input labeled "Grain Bit", a first output labeled "Grain 0 Enable", and a second output labeled "Grain 1 Enable." The first input receives a multi-cast CAS enable signal over command bus 720 from a memory controller, and the second input receives the grain address bit (GR, FIG. 5). The first output is connected to column decoder 704, and the second output is connected to column decoder 706.

Dual-mode I/O circuit 708 generally operates in a first mode in which commands having a first data width (16B) are routed to and fulfilled individually at each grain, and a second mode in which commands having a second data width (32B) different from the first data width are fulfilled by at least two of the grains in parallel. Such an arrangement overcomes the overhead imposed by tCCDL constraints discussed above, by employing multi-cast column-address-strobe (mCAS) commands to two or more partnered grains, which in this example are both grains of bank 700. The address bits constituting a mCAS command are identical to both grains, except for the grain-identifier bits. As such, the depicted implementation augments the shared command and address (CA) path/logic with support for a mCAS command.

In the depicted two-grain example, dual-mode I/O circuit 708 is implemented with a multiplexer augmented with a mCAS enable signal, although other logic implementations are employed in other embodiments. Dual mode I/O circuit 708 is shown in more detail at the right of the drawing, and in this implementation includes a multiplexer 710 and two OR gates 712. Multiplexer 710 has an input receiving the grain address bit, and two output connected to respective inputs of OR gates 712. Each OR gate 712 has a first input connected to an output of multiplexer 710 and a second input receiving the multi-cast CAS enable signal.

In operation, when the multi-cast CAS enable signal is HIGH to signal that the current CAS command is a multi-cast CAS command, the outputs of OR gates 712 become HIGH, enabling the multi-cast CAS command by causing a CAS to be asserted for a selected column in both grains of bank 700. The grains then respond to the CAS in parallel to provide a higher data width. In this mode, both grains receive the mCAS command and both respond in parallel with 16B of data read from the respective address indicated on the Address Bus. When the multi-cast CAS enable signal is low, only one at a time of OR gates 712 has a high output, enabling only one of the grains at a time to receive a CAS command, thus providing normal fine-grained operation.

While bank 700 in this implementation has two grains, a higher grain count is provided in some embodiments, including multi-level multiplexer tree in dual-mode I/O circuitry 708. For example, in one exemplary embodiment with eight grains in bank 700, each grain is able to provide fine grained memory accesses with a width of 4B in the first mode, while all eight grains acting in parallel in the second mode provided accesses with a width of 32B. Dual-mode I/O circuitry 708 in such an embodiment includes a three-level multiplexer tree receiving three grain bits. In the first mode, the multiplexer tree routes CAS commands to the appropriate grain being addressed, and causes only a single one of the eight column decoders to the activated. In the second mode, dual-mode I/O circuitry responds to a multi-cast CAS command by enabling all eight of the column decoders, causing the CAS command to be asserted at each grain.

Figure 8:
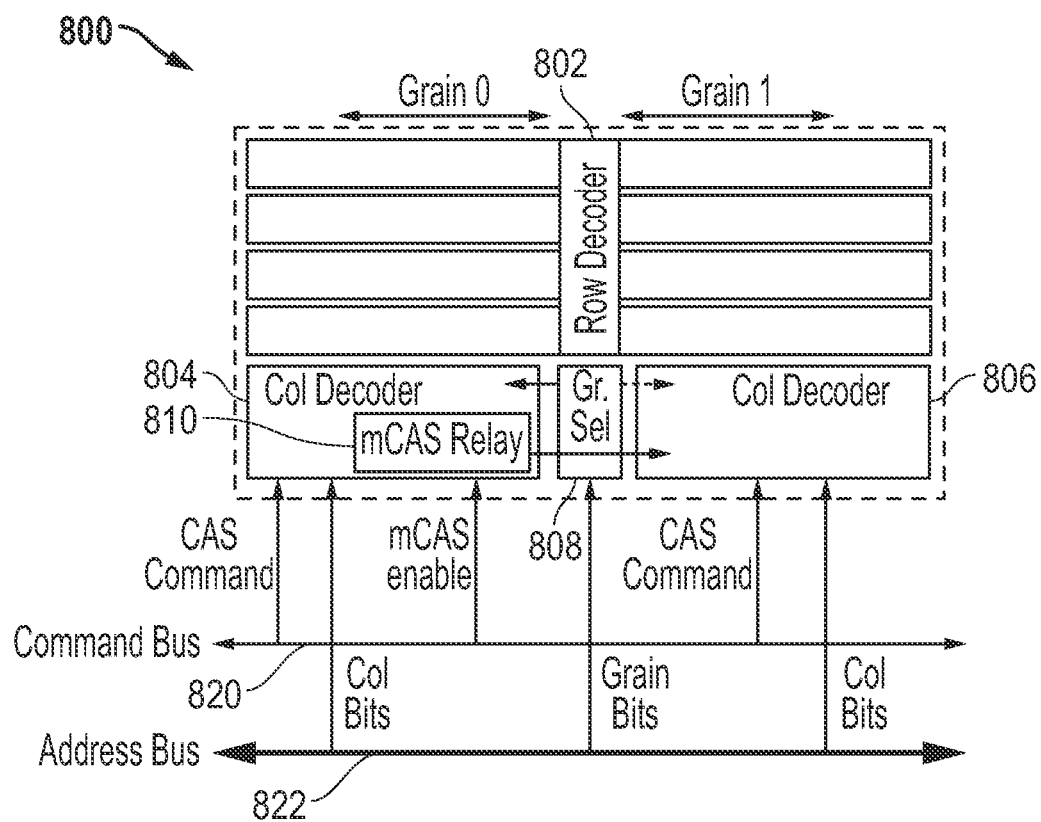
FIG. 8 illustrates in block diagram form a fine-grained memory bank according to some additional embodiments.

FIG. 8 illustrates in block diagram form a fine-grained memory bank 800 according to some additional embodiments. Memory bank 800 includes two grains labeled "Grain 0" and "Grain 1", and I/O circuitry including a row decoder 802, two column decoders 804 and 806, a row buffer in each grain (not shown separately), a grain select circuit 808 labelled "Gr. Sel", a multi-cast CAS relay circuit 810 labelled "mCAS relay", a command bus 820, and an address bus 822.

In this embodiment, a dual mode I/O circuit is embodied as multi-cast CAS relay circuit 810 rather than a multiplexer tree implementation such as that of FIG. 7. When there are a large number of grains per bank (for example, number "G" of grains such as 8 or 16), the additional depth of a multiplexer tree implementation causes an increase in the critical path command latency. Instead of using a multiplexer tree, the depicted implementation performs localized, asynchronous repeat (relay) of the CAS signals with multi-cast CAS relay circuit 810. Multi-cast CAS relay circuit 810 is co-located with column decoder 804 of Grain 0, and includes a first input receiving the mCAS enable signal, and an output connected to the column decoder of Grain 1. In embodiments with more than two grains, a multi-cast CAS relay circuit 810 is present in the I/O circuitry for multiple grains in order to forward the mCAS to other grains. The structure of multi-cast CAS relay circuit 810 has lower capacitance than a multiplexer-tree implementation due to its shorter electrical conductors, and therefore does not increase the command latency too much when there are many grains.

In operation, memory bank 800 is accessed with commands such as the depicted column-address-strobe (CAS) commands sent over the Command Bus from a memory controller. As shown, the address bus carries column address bits (C0, FIG. 4) to column decoders 804 and 806, and a grain bit (GR, FIG. 4) to grain selector circuit 808, according to the address scheme of FIG. 4. In a first mode, memory accesses are the width of one grain, in this example 16B. In a second mode, memory accesses are the width of two or more grains (two in this example, for a total of 32B). The second mode is activated by the mCAS enable signal fed to multi-cast CAS relay circuit 810 from the memory controller. In the second mode, multi-cast CAS relay circuit 810 performs in the second mode to forward a localized relay of the multi-cast CAS command to another one of the at least two of the grains by replacing the initial grain-identifier value in the multi-cast CAS command with a new value identifying the other grain. In some embodiments, multi-cast CAS relay circuit 810 identifies the new value using a lookup-table or an adder.

While two different implementations for a dual-mode I/O circuit are described with respect to FIG. 7 and FIG. 8, other suitable digital logic schemes may be implemented in the memory to perform the steps of operating in the first and second modes.

Figure 9:
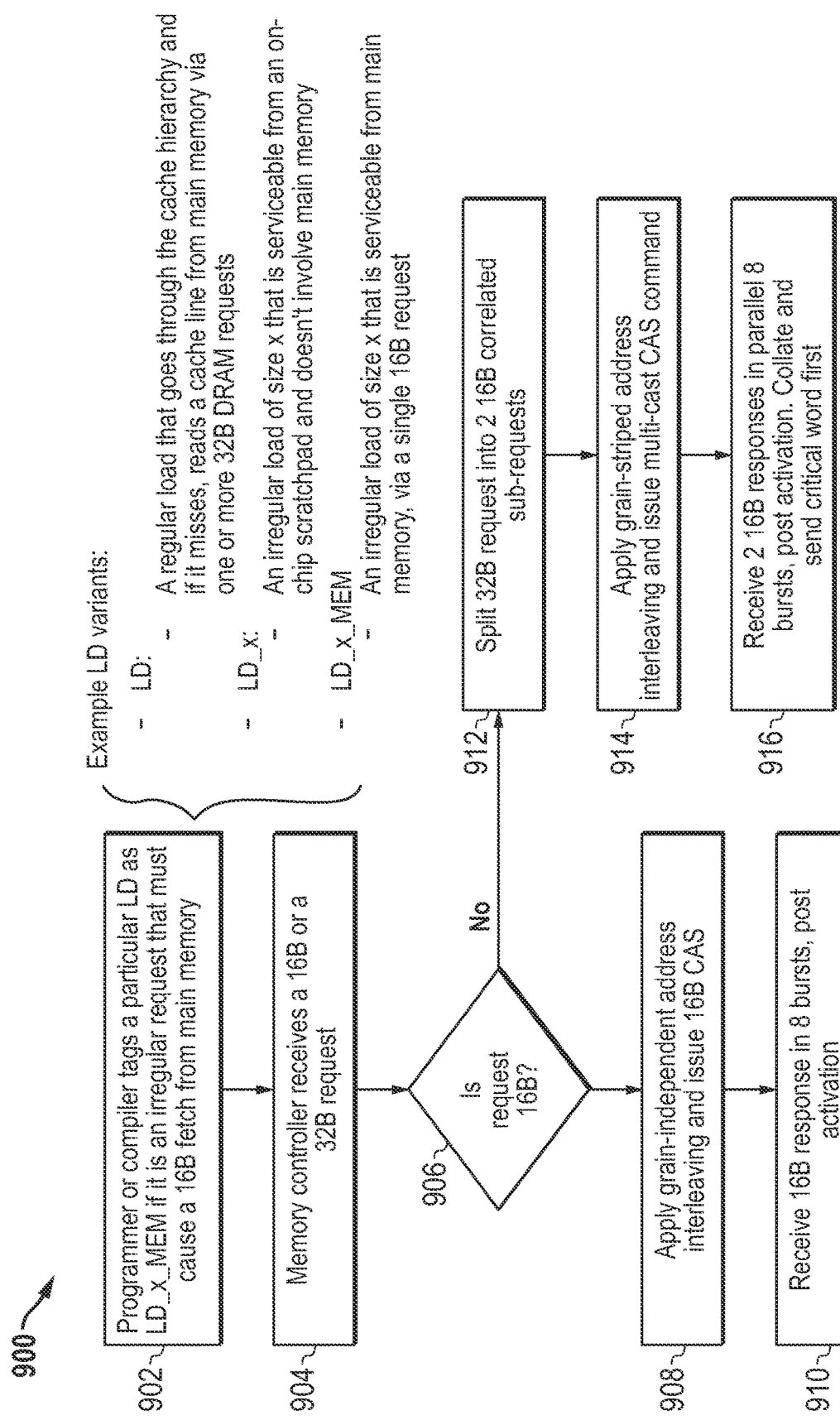
FIG. 9 shows a flow diagram of a process for operating a fine-grained memory according to some embodiments.

FIG. 9 shows a flow diagram 900 of a process for operating a fine-grained memory according to some embodiments. In this implementation, the process employs three variants of memory load (read) commands as listed on the right, including an "LD" command that employs 32B requests to main memory in the event of a cache miss, an "LD_x" command specifying an irregular load size "x" that is serviceable from an on-chip scratchpad and not from main memory, and a "LD_x_MEM" command that specifies an irregular load of size x that is serviceable from main memory via a single 16B request.

As shown at block 902, the process includes tagging a selected LD memory access request as an LD_x_MEM request if it is an irregular request that must cause a 16B fetch from main memory. The tagging at block 902 may be performed by the programmer creating the original software in which the memory access commands occur, or by a compiler or just in time compiler interpreting programming instructions for a designated memory system.

At block 904, a memory controller receives a memory access request associated with the tagged memory access request, for example when the program or library executes the instruction tagged at block 902. The request at this point may have a first data width, such as 16B as shown, or a second data width such as 32B as shown. At block 906, the process determines if the request has the first data width, for example 16B. If so, the process goes to block 908 where it applies grain-independent address interleaving to the request to fulfill the request with a fine-grained memory access of 16B width. The memory controller then issues a CAS command to a memory grain of 16B width to fulfill the command. As discussed above, this request is fulfilled in the first mode with an access to a single grain of memory in a respective memory bank. When the activation is issued for the 16B CAS at block 910, the memory controller receives the responsive data from memory in 8 bursts of 16b.

Referring again to block 906, if the request is not a 16B request, the process goes to blocks 912-914, where it fulfills the request using the dual-mode I/O circuit operating in the second mode as described above. At block 912, the 32B request is split into two 16B sub-requests correlated to each other according to the striped arrangement of grains as shown, for example, in FIG. 5. At block 914, addresses interleaving for such a grain-striped scheme is applied to the two 16B commands, and a 32B multi-cast CAS command is issued from the memory controller to fulfill both of the commands from the memory. In response to the multi-cast CAS command, the memory fulfills the request by causing a column-address-strobe to be asserted for a selected column in at least two grains in parallel. For example, dual-mode I/O circuit of 708 (FIG. 7), or multi-cast relay circuit 808 (FIG. 8), operate in the second mode to cause a multi-cast CAS command to be asserted at multiple memory grains. The resulting data is returned to the memory controller in two parallel bursts of 16B width, as shown at block 916. The memory controller may also perform collation of the received data to provide a response to the original memory request with the data in the proper order.

Figure 10:
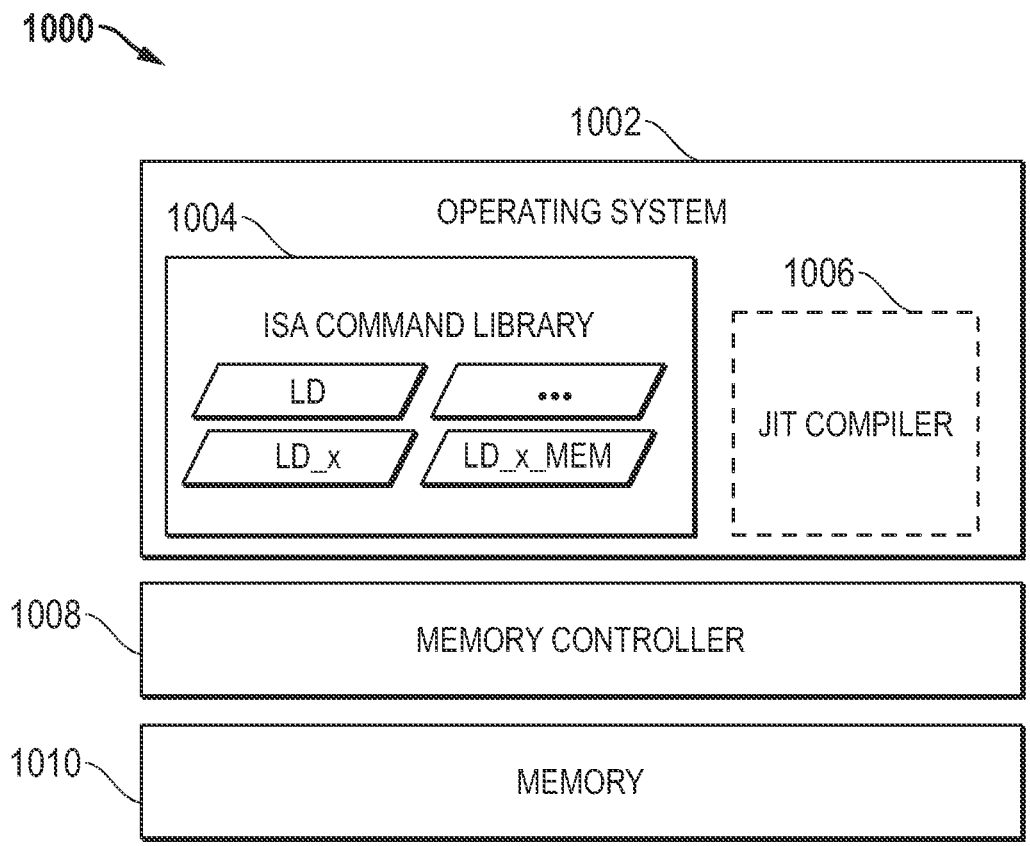
FIG. 10 illustrates in block diagram form a data processing system including library instructions for operating a fine-grained memory according to some embodiments.

FIG. 10 illustrates in block diagram form a data processing system 1000 including library instructions for operating a fine-grained memory according to some embodiments. Data processing system 1000 includes an operating system (OS) 1002, a memory controller 1008, and a memory 1010. Operating system 1002 executes on one or more processors of the data processing system and includes an instruction set architecture (ISA) command library 1004 and a just-in-time (JIT) compiler 1006.

In some implementations, an expanded ISA command library 1004 includes load commands LD_x and LD_x_MEM, as described above with respect to FIG. 9, in addition to standard LD command and other commands in the commonly-used ISA library as indicated by the ellipsis in ISA command library 1004. The additional ISA commands may be used in different ways to support accessing a fine-grained memory in two modes as described herein. The additional commands are exposed to operating system 1002 and available for use by programs executing in operating system 1002. Operating system 1002 optionally includes JIT compiler 1006, which may be employed rather than an expanded ISA command set to enable fine-grained memory access in two modes.

To provide OS-assisted memory fine-grained memory accesses in different modes, for example in the two modes described above of 16B and 32B accesses, programmers are able to compile programs which invoke the regular LD commands or the LD_x_MEM and LD_x commands. In other implementation, instead of new ISA instructions, the dual mode fine-grained access is exposed to the OS so that a programmer can annotate the memory regions that will incur irregular accesses. In such implementations, programmer requests a grain-favorable allocation using a new "malloc" (memory allocation) instruction. Responsive to such malloc instructions, the OS tags the corresponding region's Page Table Entries to indicate the access granularity, that is, whether the regions support 16B or 32B accesses. Since processor loads and stores consult the processor's Translation Lookaside Buffer (TLB) or other address translation table before accessing memory, the access granularity tags can be readily retrieved from the address translations for each command. This access granularity tag is conveyed to the memory controller, preferably as a single bit, indicating whether the associated access has a first width or a second width, for example 16B or 32B.

A significant limitation with such a mechanism is that the entire allocated memory region typically needs to have the same access granularity, or that the memory region needs to incur the same access granularity throughout the entire execution. To address these limitations, some implementations employ a hybrid approach where the programmer tags an allocated memory region with an access granularity that can be over-ridden with specific access granularity such as the LD vs LD_X_Mem ISA instructions generated by the compiler. For example, an application can tag the structure as a 32B access granularity region, however, a static compiler or JIT compiler 1006 can create an LD_X_Mem ISA instruction that can support a 16B access. Such a scheme allows dynamically switching the access granularity for a memory region from that allocated by the original application programming. As can be understood, memory 1010 includes fine-grained memory banks, which can be operated in either of the two modes as described above according to instructions from memory controller 1008 responsive to receiving the ISA commands or granularity information for a memory region.

Figure 11:
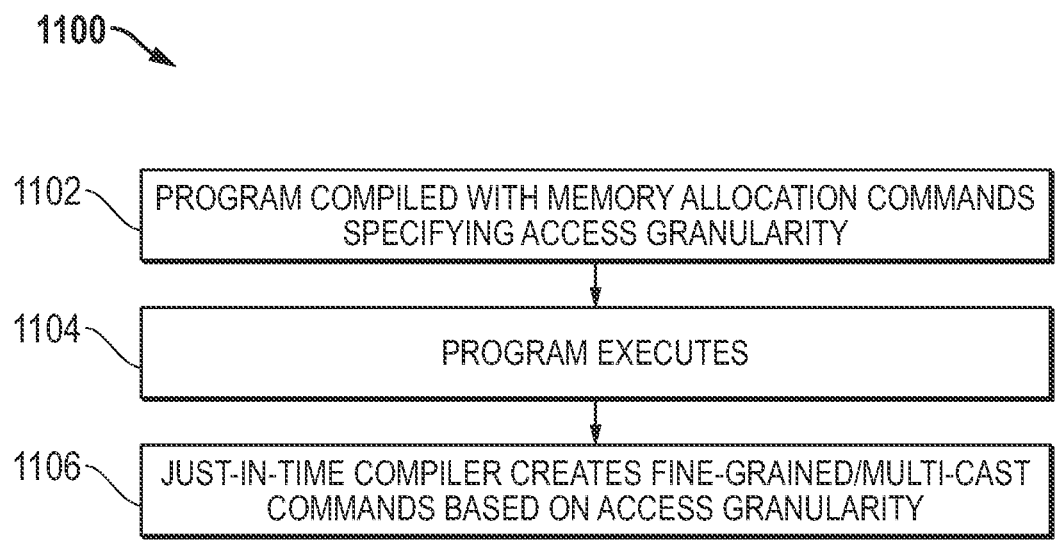
FIG. 11 shows a flow diagram of a process for operating a fine-grained memory according to some embodiments.

FIG. 11 shows a flow diagram 1100 of a process for operating a fine-grained memory according to some embodiments. At block 1102, a program is compiled as described with memory access commands specifying an access granularity from among more than one granularity, for example 16B and 32B. At block 1104, the compiled program is executed by the OS. As shown at block 1106, a just-in-time compiler such as JIT compiler 1006, based on the fine-grained access available at the memory, creates fine grained commands for the respective specified access granularity. These commands are interpreted by the memory controller to create multi-cast CAS commands for implementing the memory accesses where the second mode of access is invoked by the JIT compiler.

The circuits of FIG. 2, FIG. 3, FIG. 7, FIG. 8, or any portions thereof, such as arbiter 238 or dual-mode I/O circuit 708, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory controller 200 may vary in different embodiments. Memory controller 200 may interface to other types of memory besides DDRx, such as high bandwidth memory (HBM), RAMbus DRAM (RDRAM), and the like. While the illustrated embodiment showed each rank of memory corresponding to separate DIMMs or SIMMs, in other embodiments each module can support multiple ranks. Still other embodiments may include other types of DRAM modules or DRAMs not contained in a particular module, such as DRAMs mounted to the host motherboard. Accordingly, it is intended by the appended claims to cover all modifications of the disclosed embodiments that fall within the scope of the disclosed embodiments.

What is claimed is:

1. A fine-grained dynamic random-access memory (DRAM) comprising:
a first memory bank including a memory array divided into a plurality of grains, each grain including a row buffer and input/output (I/O) circuitry;
a second memory bank; and
a dual-mode I/O circuit coupled to the I/O circuitry of each grain in the first memory bank, the dual-mode I/O circuit operating in a first mode in which commands having a first data width are routed to and fulfilled individually at each grain, and a second mode in which commands having a second data width different from the first data width are fulfilled by at least two of the grains in parallel.

2. The fine-grained DRAM of claim 1, wherein the dual-mode I/O circuit is responsive to a multi-cast column-address-strobe (CAS) command to fulfill a command in the second mode.

3. The fine-grained DRAM of claim 2, wherein the dual-mode I/O circuit responds to the multi-cast CAS command by causing a column-address-strobe to be asserted for a selected column in at least two of the grains in parallel.

4. The fine-grained DRAM of claim 3, wherein the dual-mode I/O circuit includes a multiplexer coupled to a column decoder in the I/O circuitry of each grain in the first memory bank.

5. The fine-grained DRAM of claim 3, wherein the dual-mode I/O circuit performs in the second mode to forward a localized relay of the multi-cast CAS command to at least one of the at least two of the grains by replacing initial grain-identifier bits in the multi-cast CAS command with new values associated with different grains.

6. The fine-grained DRAM of claim 5, wherein the dual-mode I/O circuit identifies the new values using one of a lookup-table and an adder.

7. A data processing system, comprising:
a plurality of processing units;
a data fabric coupled to the plurality of processing units;
a memory controller coupled to the data fabric for fulfilling memory access requests from the processing units; and
fine-grained dynamic random-access memory (DRAM) in communication with the memory controller, the fine-grained DRAM comprising:
a first memory bank including a memory array divided into a plurality of grains, each grain including a row buffer and input/output (I/O) circuitry;
a second memory bank; and
a dual-mode I/O circuit coupled to the I/O circuitry of each grain in the first memory bank, the dual-mode I/O circuit operating in a first mode in which commands having a first data width are routed to and fulfilled individually at each grain, and a second mode in which commands having a second data width different from the first data width are fulfilled by at least two of the grains in parallel.

8. The data processing system of claim 7, wherein the dual-mode I/O circuit is responsive to a multi-cast column-address-strobe (CAS) command to fulfill a command in the second mode.

9. The data processing system of claim 8, wherein the dual-mode I/O circuit responds to the multi-cast CAS command by causing a column-address-strobe to be asserted for a selected column in at least two of the grains in parallel.

10. The data processing system of claim 9, wherein the dual-mode I/O circuit includes a multiplexer coupled to a column decoder in the I/O circuitry of each grain in the first memory bank.

11. The data processing system of claim 9, wherein the dual-mode I/O circuit performs in the second mode to forward a localized relay of the multi-cast CAS command to at least one of the at least two of the grains by replacing initial grain-identifier bits in the multi-cast CAS command with new values associated with different grains.

* * * * *